United States Patent
Llapitan et al.

(10) Patent No.: US 6,327,147 B1
(45) Date of Patent: Dec. 4, 2001

(54) RETENTION MECHANISM AND ELECTRONIC MODULE MOUNTING SYSTEM

(75) Inventors: David J. Llapitan, Puyallup; Michael Crocker, Tacoma; Ben Broili, Renton; Peter A. Davison, Puyallup; Joseph Benefield, Olympia, all of WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/475,710

(22) Filed: Dec. 30, 1999

(51) Int. Cl.[7] .................. H05K 7/20; H05K 9/00
(52) U.S. Cl. .......... 361/704; 174/35 R; 174/51; 361/710; 361/719; 361/720; 361/753; 361/809; 361/810; 361/818; 439/92; 439/108; 439/630; 439/947; 439/327
(58) Field of Search .................. 174/35 R, 36, 174/35 C, 51, 52.1; 361/704, 707, 710, 715, 719–720, 753, 799–801, 807, 809, 810, 816, 818; 439/92, 95, 101, 108, 607, 609, 630, 939, 941, 947

(56) References Cited

U.S. PATENT DOCUMENTS 5,574,466 * 11/1996 Reed et al. .................. 342/359
5,828,960 * 10/1998 Tang et al. .................. 455/446
6,074,231 * 6/2000 Ju .................. 439/327
6,115,580 * 9/2000 Chuprun et al. .................. 455/1
6,162,069 * 12/2000 Choy .................. 439/92
6,174,176 * 1/2001 Hong .................. 439/92

OTHER PUBLICATIONS

Terrain–3D, web pages from Internet site http://206.27.208.202/3dterrain.html, no date provided, Dec. 1999.*

Dec./1999, Sep./2000.*

* cited by examiner

*Primary Examiner*—Gregory Thompson
(74) *Attorney, Agent, or Firm*—Schwegman, Lundberg, Woessner & Kluth, P.A.

(57) ABSTRACT

A retention mechanism is formed of a molded plastic member having a base portion with at least one through-hole and a first through-slot adjacent thereto. The plastic member includes a card receiving structure having an open side, and a second receiving structure having an open side with a second through-slot through a wall of the receiving structure perpendicular to the base portion. Inserted in the plastic member is an elongate metal member having a base portion and a distal end. The metal member extends through the first and second through-slots with the base portion positioned adjacent the base portion and the distal portion positioned within the second receiving structure. The distal portion of the metal member is formed to provide spring action against a member inserted into the second receiving structure.

20 Claims, 9 Drawing Sheets

US 6,327,147 B1

RETENTION MECHANISM AND ELECTRONIC MODULE MOUNTING SYSTEM

TECHNICAL FIELD OF THE INVENTION

The present invention relates generally to mounting electronic components to a motherboard, and more particularly to mounting brackets with heat sinks and in particular to grounding a heat sink using an electromagnetic interference (EMI) retention module.

BACKGROUND

For a variety of reasons most electronic systems are modular in design. Different aspects or functions of a system are implemented on different circuit boards, thus allowing systems of varying degrees in functionality to be easily put together by including or excluding certain circuit boards. Modularity also allows systems to be easily upgraded with additional functions by adding or replacing certain circuit boards. Often, one of the circuit boards is considered to be the main circuit board, to which all the other circuit boards are connected. The main circuit board is often referred to as the backplane or the motherboard, whereas the other circuit boards are often referred to as the add-on boards/cards or daughter cards. For example, in the case of personal computers the circuit board where the main components such as the processor and the memory are mounted is often considered the motherboard. The expansion or optional functions, such as serial/parallel interfaces, game adapters, graphics and/or video adapters, network adapters, and modems, are implemented using add-on/daughter cards, which are connected to the expansion slots or connectors of the motherboard. However, in recent years, the role of the expansion slots/connectors is beginning to blur, as manufacturers begin to package processors and memory components on daughter cards, also referred to as processor cards.

A result of the increased heat dissipation and electromagnetic interference (EMI) shielding requirements of the newer high speed processors, continuous improvement in processor card design has been a goal of computer system designers.

SUMMARY OF THE INVENTION

According to one embodiment of the invention, there is provided a retention mechanism formed of a molded plastic member having a base portion with at least one through-hole and a first through-slot adjacent thereto. The plastic member includes a card receiving structure having an open side, and a second receiving structure having an open side with a second through-slot through a wall of the receiving structure perpendicular to the base portion. Inserted in the plastic member is an elongate metal member having a base portion and a distal end. The metal member extends through the first and second through-slots with the base portion positioned adjacent the base portion and the distal portion positioned within the second receiving structure. The distal portion of the metal member is formed to provide spring action against a member inserted into the second receiving structure.

DETAILED DESCRIPTION OF THE DRAWINGS

Figure 1:
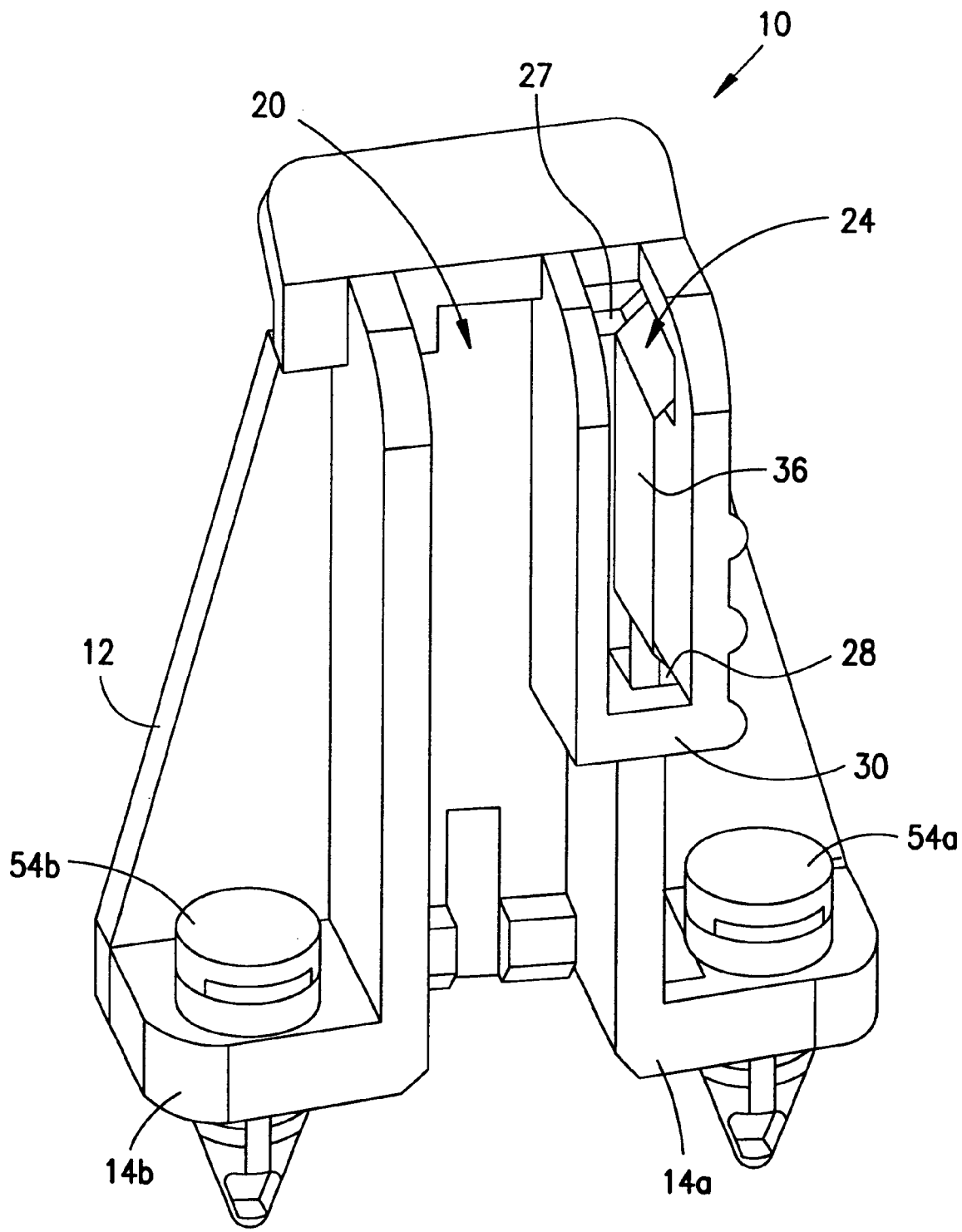
FIGS. 1–7 illustrate an embodiment of the retention mechanism according to the present invention.
Figure 2:
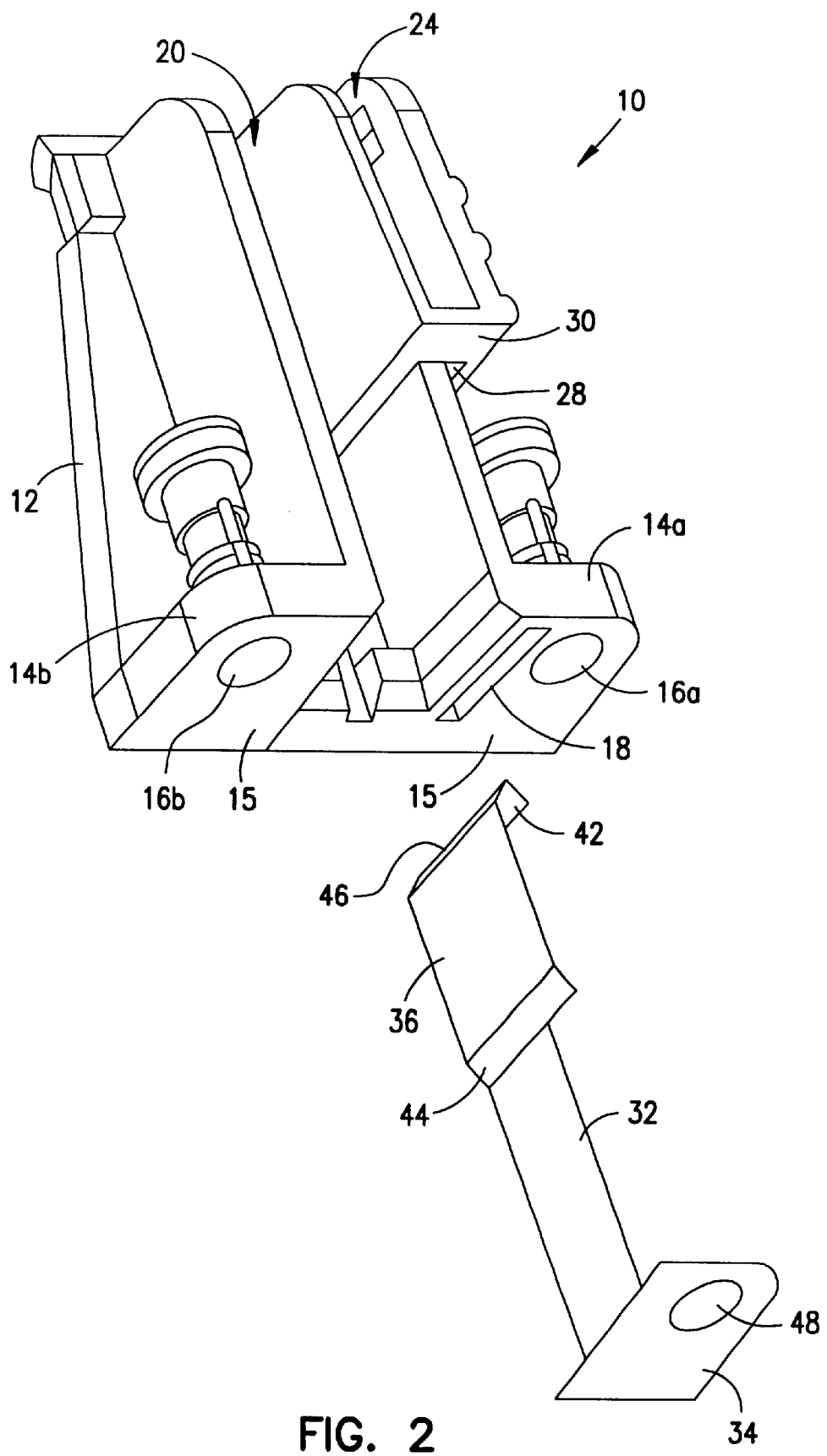
Figure 3:
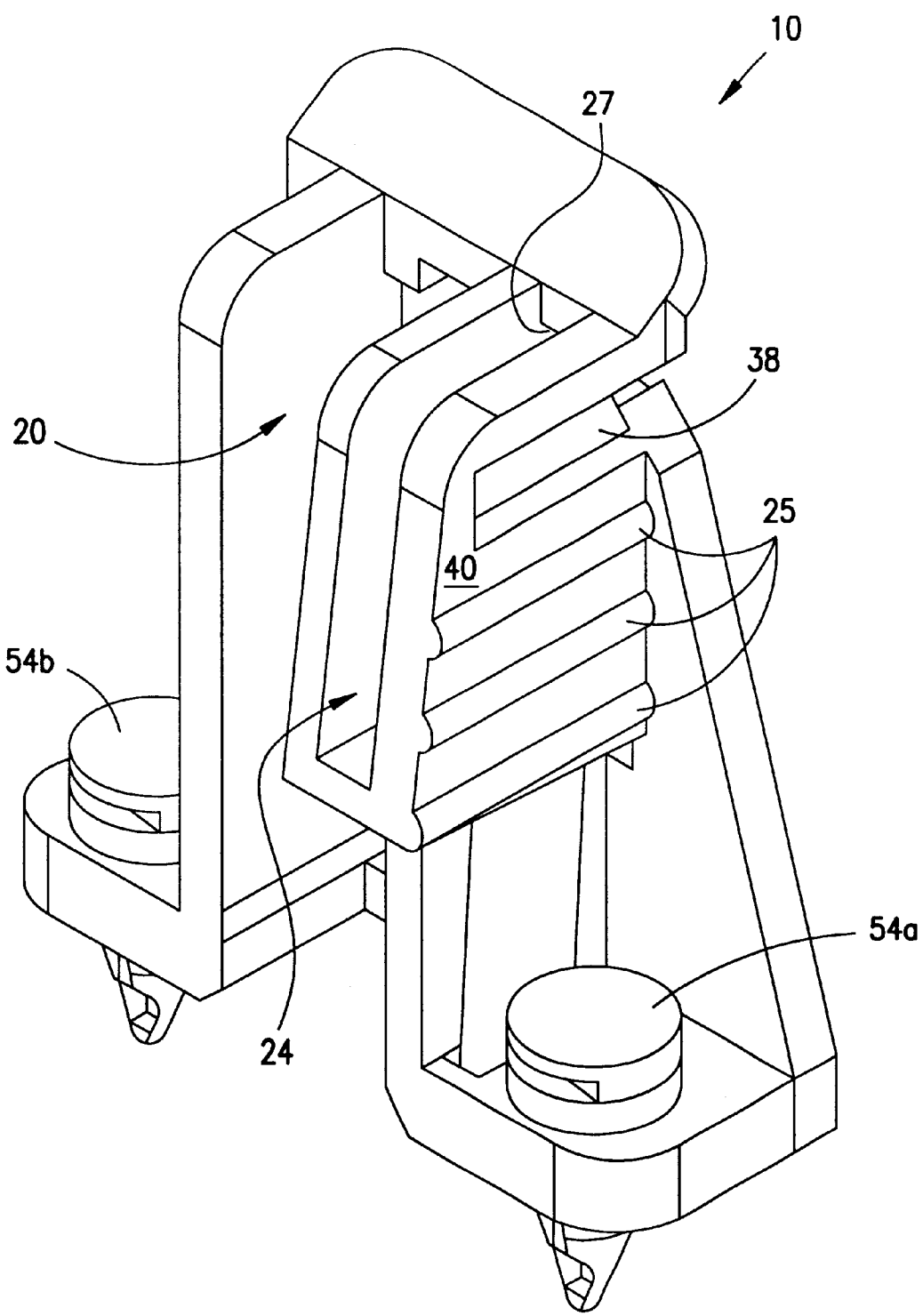
Figure 4:
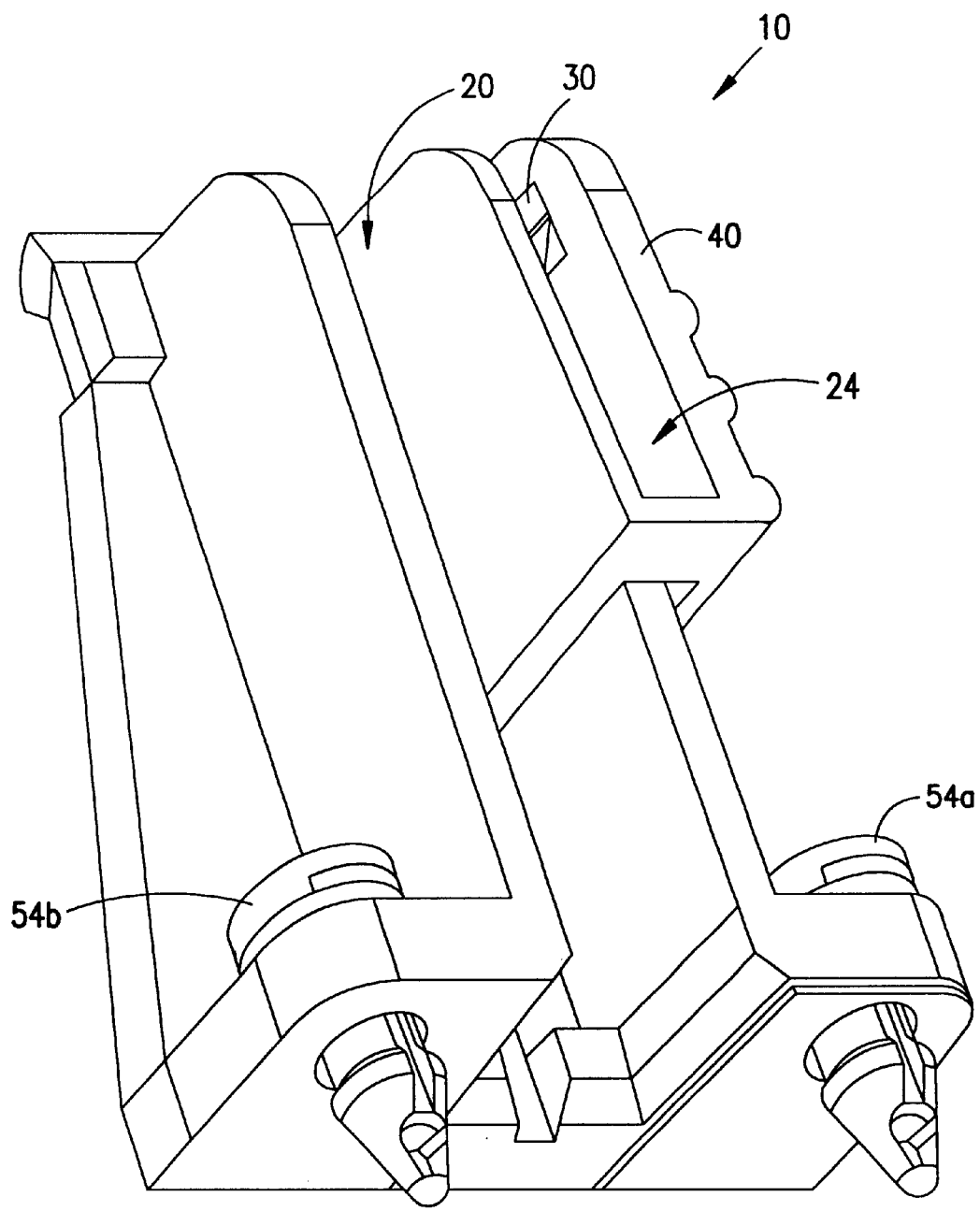
Figure 5:
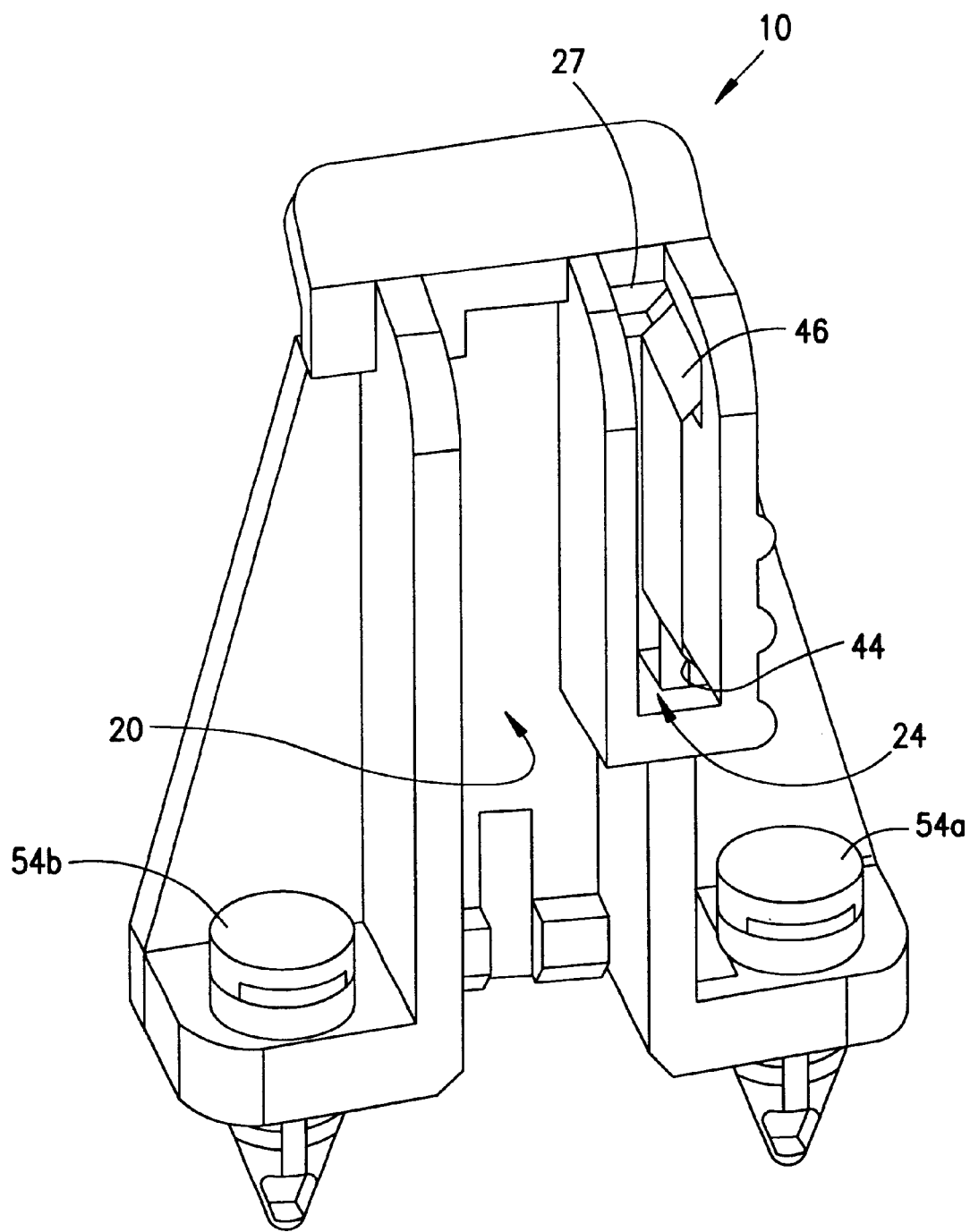
Figure 6:
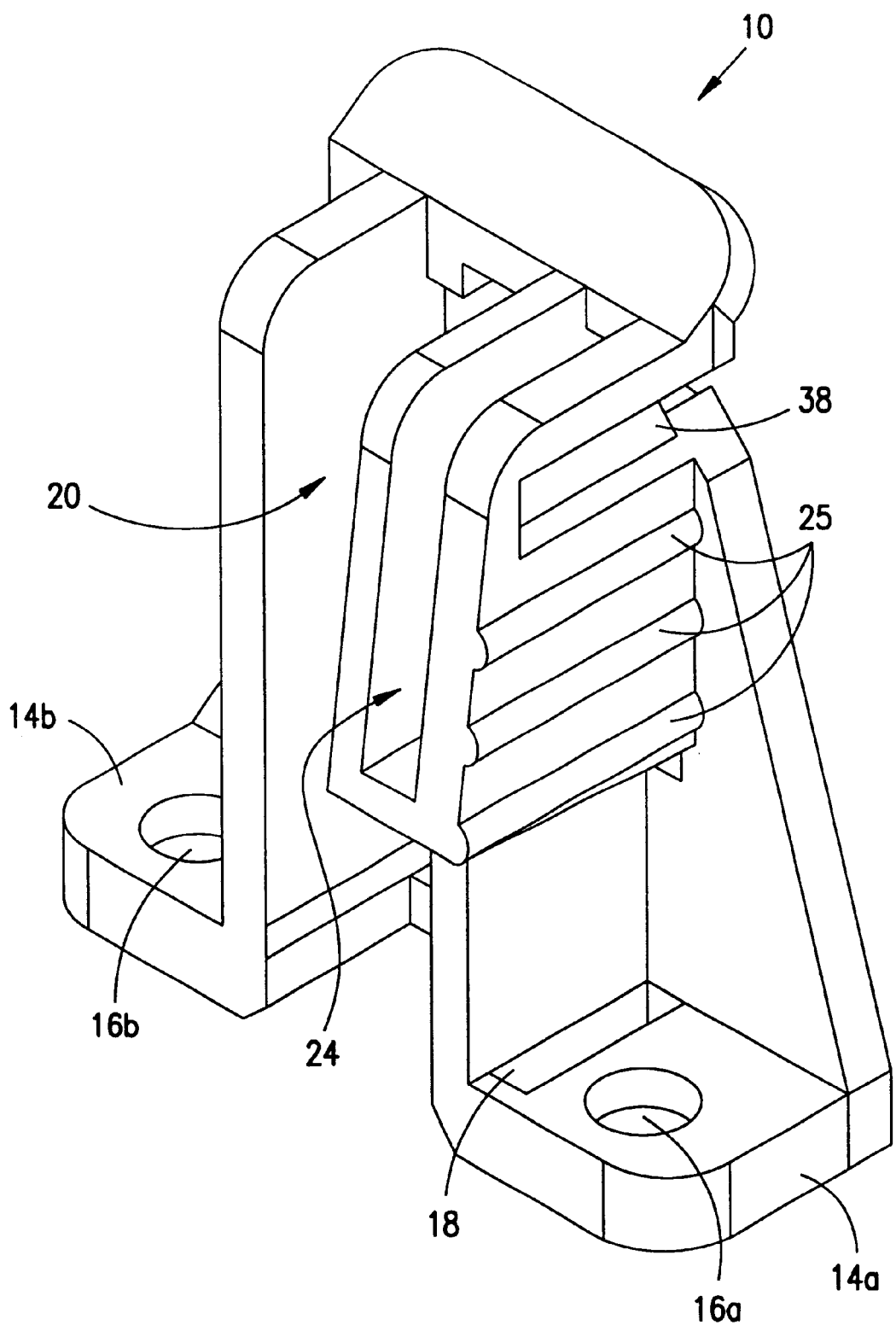
Figure 7:
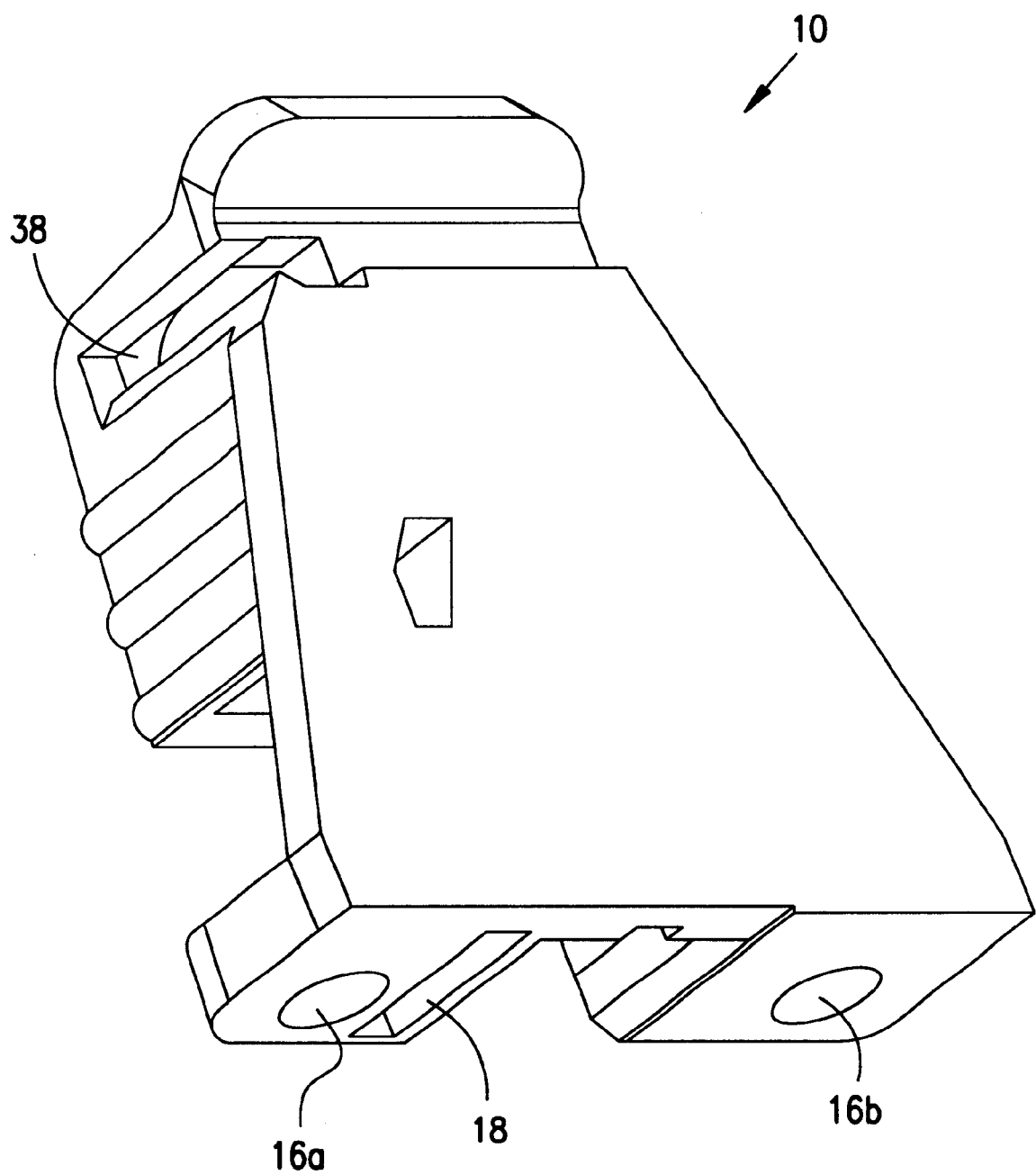

In the following detailed description of the invention reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

Referring now to FIGS. 1–7, there is illustrated a first embodiment of a retention mechanism 10 according to the present invention. As illustrated, retention mechanism 10 is formed of a molded plastic member 12 having base portions 14a and 14b with a through-hole 16a with a first through-slot 18 adjacent thereto through portion 14a, and a through-hole 16b through portion 14b. Member 12 includes a printed circuit board module receiving structure 20 with an open side or face, and a heat sink receiving structure 24 having an open side or face with a second through-slot 28 through a wall 30 of the receiving structure 24 parallel to the bottom surface 15 of base portions 14a and 14b. Molded reinforcing ribs 25 are used to strengthen the heat sink receiving structure 24. A latching surface 27 is provided to catch and retain an edge of a member inserted therein, as described more fully below.

An elongate metal member 32 is inserted in the member 12. It includes a base portion 34 and a distal portion 36, and extends through the first and second through-slots 18 and 28 with the base portion 34 positioned adjacent the base portion 14a of the member 12 and the distal portion 36 positioned within the second receiving structure 24. The distal portion 36 of the metal member is formed to provide spring action of approximately five ounces, in one example embodiment, against a heat sink member inserted into the receiving structure 24. As illustrated in particular in FIG. 3, the receiving structure 24 includes a through-slot 38 on a wall 40 thereof, which is spaced longitudinally away from the through-slot 28. The distal portion 36 of member 32 includes a distal end 42 passing through the through-slot 38.

According to one embodiment, the metal member 32 is substantially flat in cross section and the distal portion 36 includes bend 44 and bend 46 to provide spring action. The base portion 34 includes a through-hole 48 which is aligned with the through-hole 16 and formed to lie flat against a bottom surface of the base portion 14a of the member 12.

Figure 8:
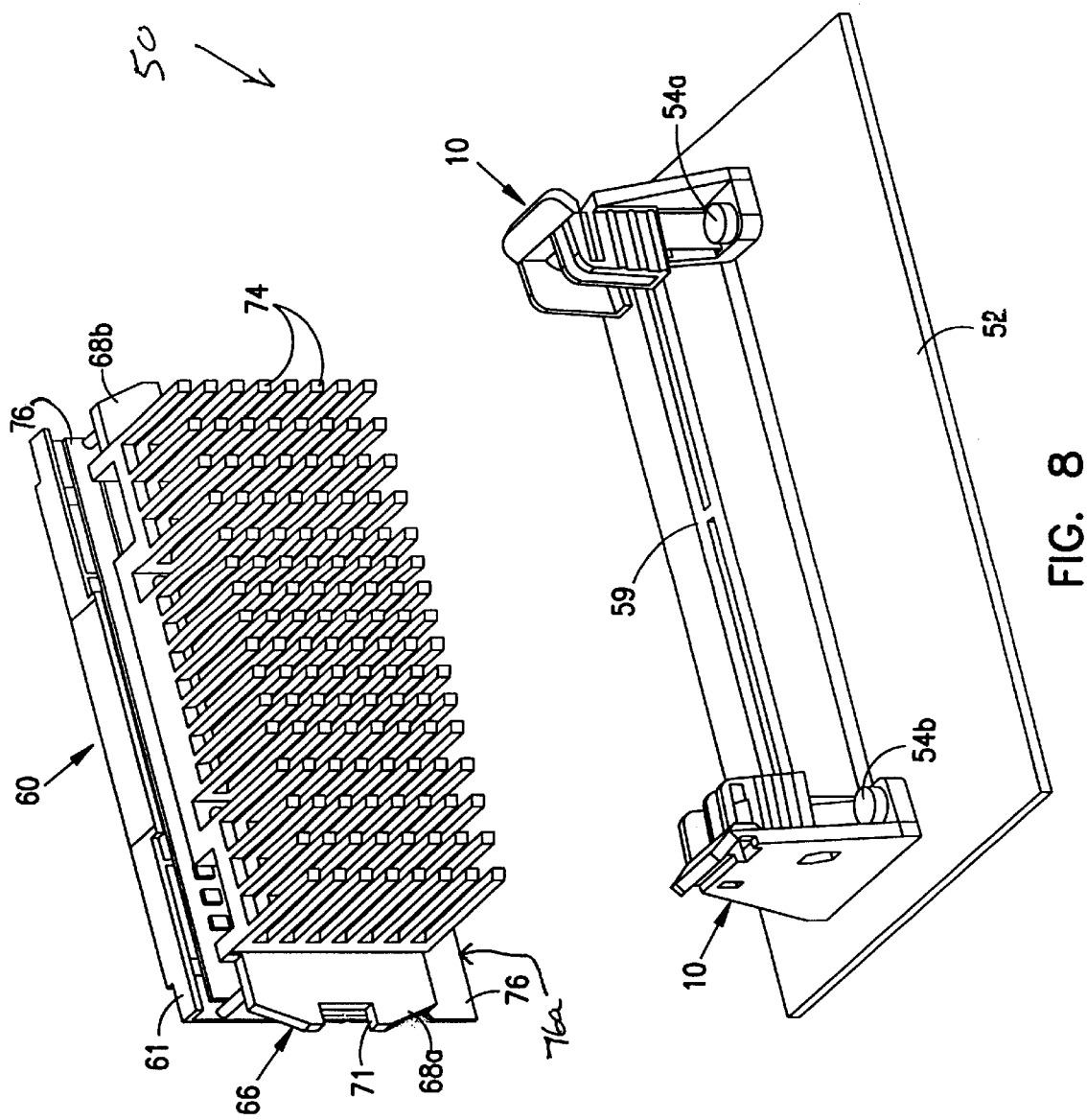
FIGS. 8–9 illustrate an embodiment of a mounting system according to the present invention.
Figure 9:
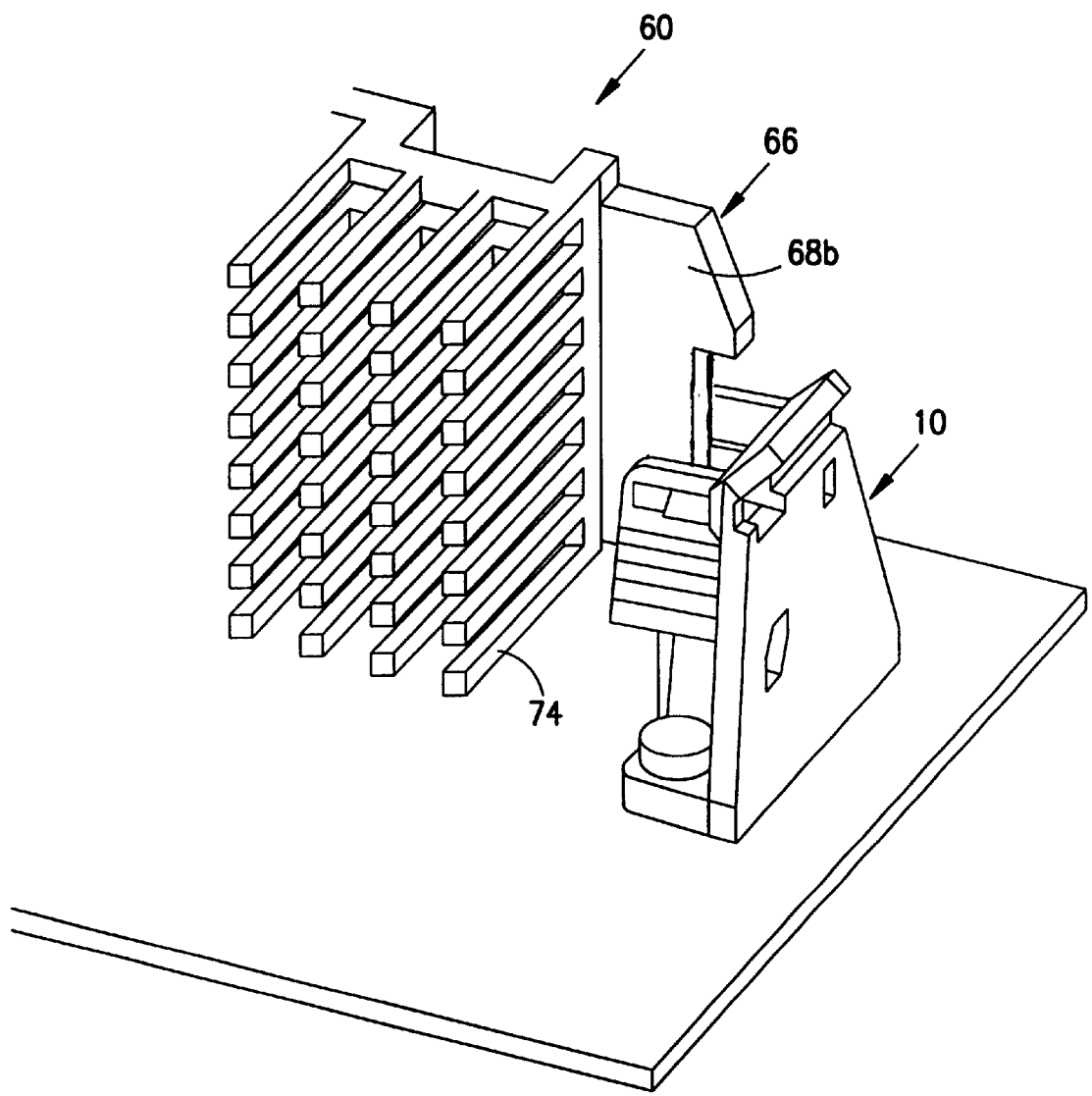

Referring now to FIGS. 8–9, there is illustrated a retention system 50. System 50 includes a pair of retention mechanisms 10 mounted to a printed circuit board 52, for example a motherboard, with fastenal fasteners 54a and 54b, which pass through holes 16a and 16b, and the corresponding respective through-holes 48 of the metal members 32 in each mechanism. Fasteners 54a and 54b are screwed into corresponding holes in board 52. As illustrated, the retention mechanisms 10 are mounted spaced apart and facing one another on the printed circuit board 52, and with the base portions of the metal members 32 sandwiched between the base portions 14a and 14b of the retention mechanism 10 and the printed circuit board 52. Grounding pads are provided on the board 52 directly underneath where end 34 of member 32 engages the board 52. The ground pads provide an electrical path to the board's ground circuit, in order to suppress EMI from the electronic module 60. The printed circuit board 52 further includes a female edge connector 59 mounted to the board in-between the retention mechanisms 10. Further, in one embodiment, retention mechanisms 10 are mounted on the board 52 so as to tilt inward toward each other approximately 3.2 degrees from an axis orthogonal to the board 52, to apply a compressive force to the ends of a heat sink member 66 when it is inserted.

As illustrated, an electronic module 60 includes a printed circuit board 76, a shield 61, and a heat sink and EMI shielding member 66. The circuit board 76 includes a male edge connector 76a that is inserted in the connector 59. Heat sink or EMI shield member 66 has ends 68a and 68b that are inserted in the receiving structure 24. According to this embodiment, the ends 68a and 68b are each portions of a metal plate or other conductive structure that act against the spring action of the metal members 32 to hold the metal members 32 and the ends in electrical contact with one another. As also illustrated, in one embodiment, the module 60, for example a processor module, includes heat dissipation prongs 74. When inserted in the retention mechanisms 10, an edge 71 catches an surface 27, to keep the module 60 latched in place. member 32 and connecting the other end of the metal member 32 to the printed circuit board 52 by sandwiching it between the printed circuit board 52 and the retention mechanism 10 supporting the electronic module 60.

Retention mechanism 10 may be molded from any suitable plastic or other material. Metal member 32 can be formed from any suitable metal or other material. However, the invention is in no way limited in these respects.

Although specific embodiments have been illustrated and described herein, it will be appreciated by those of ordinary skill in the art that any arrangement which is calculated to achieve the same purpose may be substituted for the specific embodiment shown. This application is intended to cover any adaptions or variations of the present invention. Therefore, it is manifestly intended that this invention be limited only by the claims and equivalents thereof.

What is claimed is:

1. A retention mechanism, comprising:
    a member having a base portion with at least one through-hole and a first through-slot adjacent thereto, a receiving structure having an open side with a second through-slot through a bottom wall thereof facing the base portion; and
    an elongate conductive member having a base end and a distal portion, the conductive member extending through the first and second through-slots with the base end positioned adjacent the base portion and the distal portion positioned within the receiving structure, the distal portion of the conductive member formed to provide spring action against a planar member inserted into the receiving structure.

2. The retention mechanism according to claim 1 further wherein the receiving structure includes a third through-slot on a side-wall thereof spaced longitudinally away from the second through-slot, and further wherein the distal portion has a distal end passing through the third through-slot to fix a distal end of the member in the position relative to the receiving structure.

3. The retention mechanism according to claim 2 wherein the metal member is substantially flat in cross section and the distal portion includes at least one bend in the metal member to provide the spring action.

4. The retention mechanism according to claim 1 wherein the metal member is substantially flat in cross section and the base end includes a fourth through-hole which is aligned with the first through-hole and formed to lie flat against a bottom surface of the base portion.

5. The retention mechanism according to claim 1 wherein the retention mechanism includes at least two through-holes through the base portion.

6. A retention system, comprising:
    a pair of molded plastic members each having:
        i) a base portion with at least one through-hole and a first through-slot adjacent thereto, a receiving structure having an open side with a second through-slot through a bottom wall of the receiving structure perpendicular to the base portion; and
        ii) an elongate metal member having a base end and a distal end, the metal member extending through the first and second through-slots with the base end positioned adjacent the base portion and the distal portion positioned within the receiving structure, the distal portion of the metal member formed to provide spring action against a planar member inserted into the receiving structure; and
    the molded plastic members mounted spaced apart on a printed circuit board with the open sides of the receiving structures facing one another, and with the base end of the metal member sandwiched between the base portion of the retention mechanism and the printed circuit board.

7. The retention system according to claim 6 further wherein the receiving structure includes a third through-slot on a side wall thereof spaced longitudinally away from the second through-slot, and further wherein the distal portion has a distal end passing through the third through-slot to fix it in position in the receiving structure.

8. The retention system according to claim 7 wherein the metal member is substantially flat in cross section and the distal portion includes at least one bend in the metal member to provide the spring action.

9. The retention system according to claim 6 wherein the metal member is substantially flat in cross section and the base portion includes a fourth through-hole which is aligned with the first through-hole.

10. The retention system according to claim 6 wherein the retention mechanism includes at least two through-holes through the base portion.

11. The system according to claim 6 further including an electronic module with opposite ends mounted with one end in each of the retention mechanisms.

12. The system according to claim 11 further wherein the module includes a heat sink or EMI shield member having opposite ends each of which are inserted in one of the receiving structures, and further wherein the end is a conductor that acts against the spring action of the metal member to hold the metal member and the ends in electrical contact with one another.

13. The system according to claim 12 wherein the heat sink or EMI shield includes heat dissipation structures.

14. The system according to claim 6 further including an female edge connector mounted to the board in-between the retention mechanisms.

15. The system according to claim 14 further wherein the module includes a male edge connector inserted in the edge connector.

16. A method of mounting an electronic module with an EMI shield and heat sink structure to a printed circuit board comprising connecting the structure to a first end of an elongate metal member using spring action obtained by at least one bend in the metal member and connecting the other end of the metal member to the printed circuit board by sandwiching it between the printed circuit board and a retention mechanism supporting the electronic module.

17. The method according to claim 16 further including mounting a male edge connector of the electronic module in a female edge connector mounted on the printed circuit board.

18. The method according to claim 17 further including providing heat dissipation structures on the structure.

19. The method according to claim 17 further wherein the electronic module has two ends and including supporting each end of the electronic module with a retention mechanism.

20. The method according to claim 16 further including bending the elongate metal member to provided the other end to connect with the printed circuit board and to provide the first end with spring action.

* * * * *